US012666965B2

(12) United States Patent
Suenaga et al.

(10) Patent No.: US 12,666,965 B2
(45) Date of Patent: Jun. 23, 2026

(54) BONDED BODY, CERAMIC CIRCUIT SUBSTRATE, AND SEMICONDUCTOR DEVICE

(71) Applicant: Niterra Materials Co., Ltd., Yokohama (JP)

(72) Inventors: Seiichi Suenaga, Yokohama (JP); Maki Yonetsu, Mitaka (JP); Sachiko Fujisawa, Kawasaki (JP); Yoichiro Mori, Yokohama (JP)

(73) Assignee: Niterra Materials Co., Ltd., Yokohama (JP)

( * ) Notice: Subject to any disclaimer, the term of this patent is extended or adjusted under 35 U.S.C. 154(b) by 588 days.

(21) Appl. No.: 18/163,466

(22) Filed: Feb. 2, 2023

(65) Prior Publication Data

US 2023/0187310 A1 Jun. 15, 2023

Related U.S. Application Data

(63) Continuation of application No. PCT/JP2021/037152, filed on Oct. 7, 2021.

(30) Foreign Application Priority Data

Oct. 7, 2020 (JP) ................................. 2020-169538

(51) Int. Cl.
*C22C 9/00* (2006.01)
*C22C 9/02* (2006.01)
(Continued)

(52) U.S. Cl.
CPC ......... *H10W 40/255* (2026.01); *H10W 70/66* (2026.01)

(58) Field of Classification Search
CPC ........... H01L 23/3735; H01L 23/49866; H01L 23/15; H01L 23/142; B22F 7/062;
(Continued)

(56) References Cited

U.S. PATENT DOCUMENTS 5,664,723 A * 9/1997 Sastri ....................... B23K 1/19
228/208
2016/0167170 A1 6/2016 Terasaki et al.
(Continued)

FOREIGN PATENT DOCUMENTS

CN 105393347 A 3/2016
CN 105452194 A 3/2018
(Continued)

OTHER PUBLICATIONS

Huang et al., "Crystal structure and X-ray diffraction pattern of CuSnTi3 intermetallic phase", vol. 13, p. 87-92 (Year: 2005).*
(Continued)

*Primary Examiner* — Dale E Page
*Assistant Examiner* — Cristian A Tivarus
(74) *Attorney, Agent, or Firm* — Oblon, McClelland, Maier & Neustadt, L.L.P.

(57) ABSTRACT

According to the embodiment, a bonded body includes a ceramic substrate, a copper plate. A bonding layer is located on at least one surface of the ceramic substrate. The bonding layer bonds the ceramic substrate and the copper plate. The bonding layer includes a Ti reaction layer including titanium nitride or titanium oxide as a major component, and a plurality of first alloys positioned between the Ti reaction layer and the copper plate. Each of the plurality of first alloys includes at least one selected from a Cu—Sn alloy and a Cu—In alloy. The first alloys have mutually-different Sn concentrations or In concentrations. According to the embodiment, a warp amount can be reduced. A heating rate and a cooling rate in the bonding process can be increased. According to the embodiment, a silicon nitride substrate is favorable for the ceramic substrate.

20 Claims, 3 Drawing Sheets

(51) Int. Cl.

| | |
|---|---|
| *H10W 40/25* | (2026.01) |
| *H10W 70/66* | (2026.01) |

(58) Field of Classification Search

CPC .. B23K 35/007; B23K 35/302; C22C 1/0425; C22C 9/00; C22C 9/02; C04B 37/02; C04B 37/023; C04B 2237/02; H05K 3/38; H05K 1/053; H05K 3/022; H05K 3/388; H10W 40/225

See application file for complete search history.

(56) References Cited

U.S. PATENT DOCUMENTS

| | | | |
|---|---|---|---|
| 2018/0318922 A1 | 11/2018 | Valls Anglés | |
| 2019/0135706 A1* | 5/2019 | Terasaki | C04B 37/021 |
| 2019/0150298 A1* | 5/2019 | Kishimoto | C22C 5/06 |
| | | | 174/252 |
| 2020/0128664 A1 | 4/2020 | Harada et al. | |

FOREIGN PATENT DOCUMENTS

| | | | |
|---|---|---|---|
| EP | 3 492 441 A1 | | 6/2019 |
| EP | 4 155 281 A1 | | 3/2023 |
| EP | 4 190 764 A1 | | 6/2023 |
| JP | 62-56379 A | | 3/1987 |
| JP | 9-283656 A | | 10/1997 |
| JP | 10-251074 A | | 9/1998 |
| JP | 2000-307040 A | | 11/2000 |
| JP | 2003283064 A | * | 10/2003 |
| JP | 2013211546 A | * | 10/2013 |
| JP | 2015-43392 A | | 3/2015 |
| JP | 2015-62933 A | | 4/2015 |
| WO | WO 2018/021472 A1 | | 2/2018 |
| WO | WO 2018/199060 A1 | | 11/2018 |

OTHER PUBLICATIONS

International Search Report issued Nov. 22, 2021 in PCT/JP2021/037152 filed on Oct. 7, 2021, 2 pages.

Zhong et al., "Wetting and diffusion mechanism of CuSn prealloy powder core composite silver brazing metal", Transactions of the China Welding Institution, Feb. 2023, vol. 44. No. 2, 26 pages (with unedited computer-generated English translation).

Linieng, "Diffusion bonding of titanium alloy to tin bronze", A Dissertation Submitted for the Degree of Master, April 4. 2018, 106 pages (with unedited computer-generated English translation).

Li et al., "Interfacial Segregation of Ti in the Brazing of Diamond Grits onto a Steel Substrate Using a Cu—Sn—Ti Brazing Alloy", Metallurgical and Materials Transactions A—Physical Metallurgy and Materials Science, vol. 33A, Jul. 2002, pp. 2163-2172.

Combined Chinese Notice of Allowance and Search Report issued Jan. 6, 2025 in Chinese Patent Application No. 202180053012.9 (with unedited computer-generated English translation), 10 pages.

Extended European Search Report issued Aug. 5, 2025 in European Patent Application No. 21877708.4, 13 pages.

* cited by examiner

BONDED BODY, CERAMIC CIRCUIT SUBSTRATE, AND SEMICONDUCTOR DEVICE

CROSS-REFERENCE TO RELATED APPLICATIONS

This is a continuation application of International Patent Application PCT/JP2021/037152, filed on Oct. 7, 2021. This application also claims priority to Japanese Patent Application No. 2020-169538, filed on Oct. 7, 2020. The entire contents of which are incorporated herein by reference.

FIELD

Embodiments described below relate to a bonded body, a ceramic circuit substrate, and a semiconductor device.

BACKGROUND

A bonded body of a ceramic substrate and a copper plate is used as a circuit board for mounting a semiconductor element or the like. WO 2018/021472 (Patent Document 1) discusses a ceramic copper circuit substrate in which a ceramic substrate and a copper plate are bonded. In Patent Document 1, a bonding layer includes a brazing material including Ag, Cu, Ti, etc. In Patent Document 1, thermal bonding is performed under a pressure of not more than $1 \times 10^{-3}$ Pa when bonding.

Such a pressure that is not more than $1 \times 10^{-3}$ Pa is called a vacuum. Also, a bonding method that uses Ti is called active metal bonding. Ti is easily nitrided or oxidized because Ti is an active metal. In active metal bonding, the bonding has been performed in a vacuum to prevent the Ti from nitriding or oxidizing before bonding. To bond in a vacuum, a vacuum must be pulled inside a bonding apparatus. Because the temperature is raised after pulling a vacuum, only batch processing could be performed in a thermal bonding process. The thermal bonding process includes the four processes per batch of pulling a vacuum, raising the temperature, bonding, and cooling. A time of not less than 24 hours per batch was necessary. Therefore, suitability for mass production was poor.

On the other hand, WO 2018/199060 (Patent Document 2) discusses performing a thermal bonding process in a continuous furnace. According to an example of Patent Document 2, bonding is performed at a feed speed of 10 cm/minute with a furnace length of 3 m. Including a holding time partway, thermal bonding is possible in about 2 hours.

DETAILED DESCRIPTION

A bonded body according to an embodiment includes a ceramic substrate, a copper plate, and a bonding layer. The bonding layer is located on at least one surface of the ceramic substrate and bonds the ceramic substrate and the copper plate. The bonding layer includes a Ti reaction layer and multiple first alloys. The Ti reaction layer includes titanium nitride or titanium oxide as a major component. The multiple first alloys are positioned between the Ti reaction layer and the copper plate. The multiple first alloys each include at least one selected from a Cu—Sn alloy and a Cu—In alloy. The multiple first alloys have mutually-different Sn concentrations or In concentrations.

Figure 1:
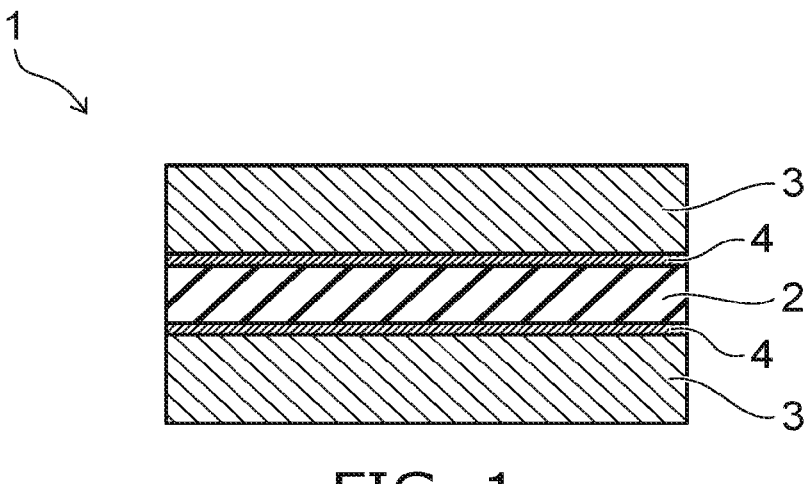
FIG. 1 is a schematic view showing an example of a bonded body according to an embodiment.
Figure 2:
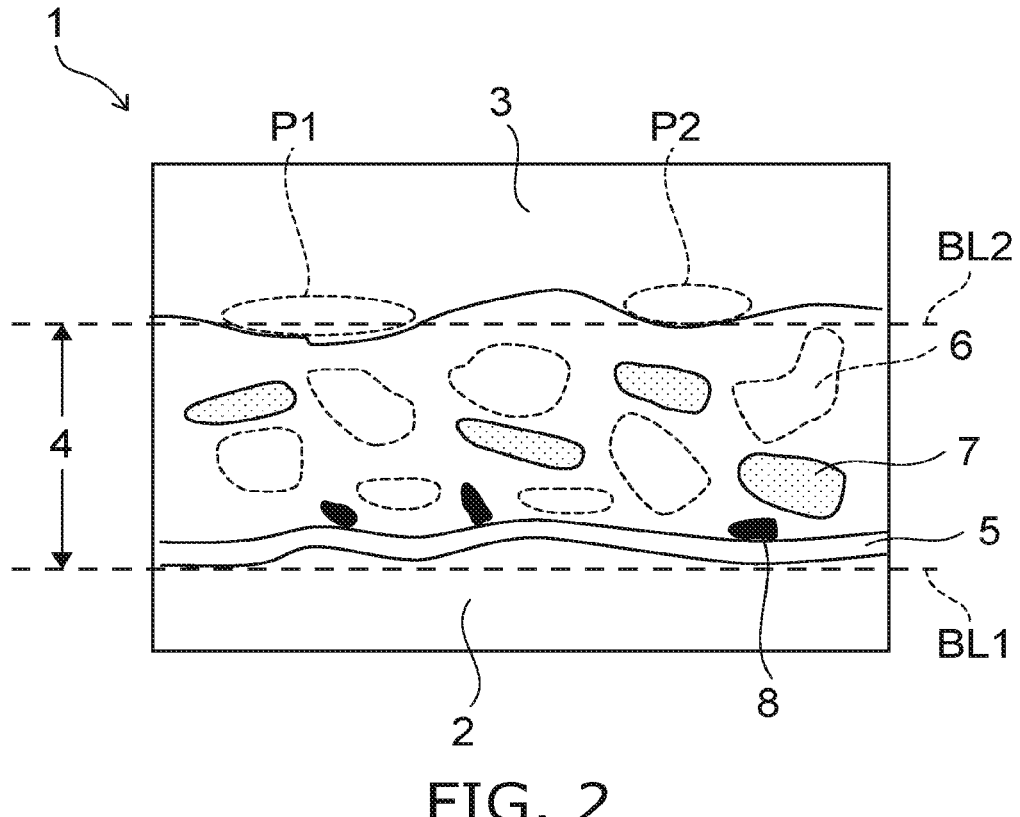
FIG. 2 is a schematic cross-sectional view showing an example of the bonding layer of the bonded body according to the embodiment.

FIG. 1 is a schematic view showing an example of the bonded body according to the embodiment. FIG. 2 is a schematic cross-sectional view showing an example of the bonding layer of the bonded body according to the embodiment. In FIGS. 1 and 2, 1 is a bonded body, 2 is a ceramic substrate, 3 is a copper plate, 4 is a bonding layer, 5 is a Ti reaction layer, 6 is a first alloy, 7 is a second alloy, and 8 is a titanium silicide grain. The first alloy 6 is shown by a dotted line in FIG. 2. The second alloy 7 is shown by dot cross hatching. The titanium silicide grain 8 is shown as solid black. In the bonded body 1 illustrated in FIG. 1, the copper plates 3 are located at the two surfaces of the ceramic substrate 2 with the bonding layers 4 interposed. Also, the longitudinal and lateral sizes of the ceramic substrate 2 are respectively equal to the longitudinal and lateral sizes of the copper plate 3. The bonded body according to the embodiment is not limited to such a configuration. The bonded body may have a structure in which the copper plate 3 is located at only one surface of the ceramic substrate 2. The longitudinal and lateral sizes of the ceramic substrate 2 may be different from the longitudinal and lateral sizes of the copper plate 3.

A silicon nitride substrate, an aluminum nitride substrate, an aluminum oxide substrate, an Alusil substrate, etc., are examples of the ceramic substrate 2. The Alusil substrate is a ceramic substrate in which aluminum oxide and zirconium oxide are mixed. It is favorable for the thickness of the ceramic substrate 2 to be not less than 0.1 mm and not more than 1 mm. There is a possibility that the strength may decrease when the substrate thickness is less than 0.1 mm. Also, there is a possibility that the ceramic substrate may become a thermal resistor and the heat dissipation of the bonded body may degrade when the substrate thickness is greater than 1 mm.

Also, it is favorable for the three-point bending strength of the silicon nitride substrate to be not less than 600 MPa. Also, it is favorable for the thermal conductivity to be not less than 80 W/m·K. The substrate thickness can be reduced by increasing the strength of the silicon nitride substrate. It is therefore favorable for the three-point bending strength of the silicon nitride substrate to be not less than 600 MPa, and more favorably not less than 700 MPa. The substrate thickness of the silicon nitride substrate can be thin, i.e., not more than 0.40 mm, or even not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low, it is favorable for the substrate thickness to be not less than 0.60 mm.

Although the three-point bending strength of an aluminum oxide substrate is about 300 to 450 MPa, an aluminum oxide substrate is inexpensive. Also, although the three-point bending strength of an Alusil substrate is high, i.e., about 550 MPa, the thermal conductivity is about 30 to 50 W/m·K.

One of a silicon nitride substrate or an aluminum nitride substrate is favorable as the ceramic substrate 2. The silicon nitride substrate and the aluminum nitride substrate are nitride ceramic substrates. A nitride ceramic forms a reaction layer having titanium nitride as a major component by reacting with an active metal brazing material including Ti. Also, an oxide ceramic forms a reaction layer having titanium oxide as a major component by reacting with an active metal brazing material including Ti. An oxide ceramic is an aluminum oxide substrate, an Alusil substrate, etc. The Ti reaction layer 5 is a layer that includes titanium nitride as a major component or a layer that includes titanium oxide as a major component. The layer that includes titanium nitride as a major component or the layer that includes titanium oxide as a major component is formed by the ceramic substrate 2 and the Ti of the active metal brazing material reacting.

It is favorable for the copper plates 3 to be located at the two surfaces of the ceramic substrate 2. Warp of the bonded body can be suppressed by bonding copper plates to the two surfaces. A pure copper plate or a copper alloy plate can be used as the copper plate 3. It is favorable for the copper plate 3 to be oxygen-free copper. The copper purity of oxygen-free copper is not less than 99.96 mass % as indicated in JIS-H-3100 (ISO 1337, etc.). Oxygen-free copper is one type of pure copper. The copper plate 3 is used as a circuit part or a heat dissipation plate. The current-carrying capacity and/or the heat dissipation can be improved by making the copper plate 3 thick. It is therefore favorable for the thickness of the copper plate 3 to be not less than 0.6 mm, or even not less than 0.8 mm.

The bonding layer 4 includes the Ti reaction layer 5 having titanium nitride or titanium oxide as a major component. The Ti reaction layer 5 is formed when using so-called active metal bonding. When the ceramic substrate 2 is a nitride ceramic, the major component of the Ti reaction layer 5 is titanium nitride (TiN). The titanium nitride that is the major component of the Ti reaction layer 5 may include a compound having a titanium-to-nitrogen atomic ratio other than 1:1. When the ceramic substrate 2 is an oxide ceramic, the major component of the Ti reaction layer 5 is titanium oxide ($TiO_2$). The titanium oxide that is the major component of the Ti reaction layer 5 may include a compound such as $TiO_2$, $TiO$, $Ti_2O_3$, or the like that has a titanium-to-oxygen atomic ratio other than 1:2.

The Ti reaction layer 5 refers to a region that is formed at the surface of the ceramic substrate 2 and has a Ti content of not less than 50 mass %. Also, it is favorable for the Ti reaction layer 5 to exist at the surface of the ceramic substrate 2 over not less than 40% and not more than 100% of a unit length of 200 μm. Being not less than 40% of the unit length of 200 μm refers to a state in which the Ti reaction layer 5 is formed over a total of not less than 40 μm per 200 μm of the surface of the ceramic substrate 2 when the cross section of the bonding layer 4 is observed.

The bonding layer 4 includes the multiple first alloys 6 positioned between the Ti reaction layer 5 and the copper plate 3. The composition ratios of the multiple first alloys 6 are different from each other. Specifically, the multiple first alloys 6 have mutually-different Sn concentrations or In concentrations. The multiple first alloys each include at least one selected from a Cu—Sn alloy and a Cu—In alloy. It is unnecessary for all of the Cu—Sn alloys or Cu—In alloys existing in the bonding layer 4 to have mutually-different Sn concentrations or In concentrations. It is sufficient for at least two first alloys 6 having mutually-different Sn concentrations or In concentrations to exist in the bonding layer 4.

The following description mainly illustrates an example in which the first alloy 6 is a Cu—Sn compound. It is also possible to replace the Cu—Sn compound with a Cu—In compound in the following example.

The Sn concentrations being different from each other refers to the Sn concentrations being not less than 2 atomic % different from each other when the total of the Cu content and the Sn content is taken to be 100 atomic %. The In concentrations being different from each other refers to the In concentrations being not less than 2 atomic % different from each other when the total of the Cu content and the In content is taken to be 100 atomic %.

The atomic ratios of Cu and Sn can be measured by energy dispersive X-ray spectroscopy (Energy Dispersive X-ray Spectroscopy: EDX) point analysis. EDX is also called EDS. Here, SEM-EDX is used as EDX. Field Emission SEM (FE-SEM) may be used as SEM.

JSM-7200F made by JEOL Ltd. or an apparatus having equivalent performance is used for FE-SEM. EX-74600U4L2Q made by JEOL Ltd. Or, an apparatus having equivalent performance is used for EDX.

The cross section of the bonding layer 4 is observed in FE-SEM. The cross section is a surface parallel to the thickness direction. The thickness direction is perpendicular to the surface of the ceramic substrate 2 and parallel to the direction connecting the ceramic substrate 2 and the copper plate 3. The measurement conditions of FE-SEM are set to an acceleration voltage of 15 kV and a magnification of 3000 times. The field area is set to the thickness of the bonding layer×40 μm in the width direction. The width direction is parallel to the surface of the ceramic substrate 2 and perpendicular to the thickness direction.

The measurement conditions of EDX are set to 50 scans and a dwell time of 0.2 ms. The dwell time is the measurement speed per pixel. When performing EDX area analysis, the number of pixels acquired is set to 256 pixels wide×198 pixels high; the detection count is set to 3700 to 4100 cps (Count Per Second); and the quantitative map is set to 5×5 bit/point. Point analysis is analysis using the result of measuring one detection count (one location). Area analysis is analysis that uses the results of measuring multiple detection counts. Area analysis also is called surface analysis.

EDX analysis may be performed after clarifying designated elements by pre-examining the elements included in the bonding layer. For example, when Cu (copper), Sn (tin), Ti (titanium), Si (silicon), O (oxygen), and N (nitrogen) are detected as elements included in the bonding layer, these elements are set as the designated elements. The area ratios can be determined by mapping the designated elements by using the area analysis results. When the thickness of the bonding layer is 30 μm, the field area is 30 μm in the thickness direction×40 μm in the width direction.

The accessory functions of SEM-EDX are used for SEM-EDX mapping. Image software is used for the mapping when a mapping function is not included.

The area ratio is calculated using the average value of EDX area analysis of three regions. The surface area (the field area) of one region is the bonding layer thickness×40 μm in the width direction. The measurement field is aligned with the bonding layer 4. Any three regions next to each other in the cross section of the bonding layer 4 are analyzed. The bonding layer 4 is the region from the boundary between the ceramic substrate 2 and the bonding layer 4 to the boundary between the bonding layer 4 and the copper plate 3.

The boundary between the ceramic substrate 2 and the bonding layer 4 is the bonding interface between the ceramic substrate 2 surface and the Ti reaction layer 5. For example, when a silicon nitride substrate is used, the bonding interface between the silicon nitride substrate and the titanium nitride layer is the boundary between the ceramic substrate 2 and the bonding layer 4. For example, a broken line BL1 shown in FIG. 2 is the boundary between the ceramic substrate 2 and the bonding layer 4.

The boundary between the bonding layer 4 and the copper plate 3 is defined using the Ti amount as a reference. At the vicinity of the boundary between the bonding layer 4 and the copper plate 3, the Ti amount decreases from the bonding layer 4 toward the copper plate 3 surface. The boundary is defined by using, as a reference, locations at which a region having a Ti amount of not more than 1 atomic % is continuously formed over 50 μm in the width direction. When multiple locations exist, the boundary between the bonding layer 4 and the copper plate 3 is defined by using the location among the multiple locations most proximate to the bonding layer 4 (the ceramic substrate 2) as a reference. In FIG. 2, a solid line SL between the bonding layer 4 and the copper plate 3 shows the set of points at which the Ti amount is 1 atomic %. As an example, the region in which the Ti amount is not more than 1 atomic % is continuously formed over 50 μm in the width direction in portions P1 and P2 at the solid line SL vicinity. The portion P1 is positioned further toward the ceramic substrate 2 side than the portion P2. Therefore, a broken line BL2 that is referenced to the portion P1 is defined as the boundary between the bonding layer 4 and the copper plate 3.

EDX point analysis is used to measure the Ti amount to determine the boundary between the bonding layer 4 and the copper plate 3. The Ti amount is determined by performing point analysis at 5 μm spacing. Also, regions that have a Ti amount of not more than 1 atomic % also include regions having a Ti amount of 0 atomic % (below the detection limit).

The first alloy 6 refers to an alloy in which the total of Cu and the first element is not less than 50 atomic % when the total of Cu, the first element, and Ti is taken to be 100 atomic %. The first element is one or two selected from Sn and In. For example, for a Cu—Sn alloy, the total of Cu and Sn is not less than 50 atomic % when the total of Cu, Sn, and Ti is taken to be 100 atomic %. For a Cu—In alloy, the total of Cu and In is not less than 50 atomic % when the total of Cu, In, and Ti is taken to be 100 atomic %. The composition of the first alloy 6 is determined by EDX point analysis.

The second alloy 7 refers to an alloy in which the total of Ti and the first element is not less than 50 atomic % when the total of Cu, the first element, and Ti is taken to be 100 atomic %. For example, for a Ti—Sn alloy, the total of Ti and Sn is not less than 50 atomic % when the total of Cu, Sn, and Ti is taken to be 100 atomic %. For a Ti—In alloy, the total of Ti and In is not less than 50 atomic % when the total of Cu, In, and Ti is taken to be 100 atomic %. The composition of the second alloy 7 is determined by EDX point analysis.

The Cu—Sn alloy may include a state in which Cu and Sn are mixed or may include a compound of Cu and Sn. The compound includes an intermetallic compound. A state in which Ti is mixed or dissolved in the Cu—Sn alloy may be used. The first alloy 6 includes an alloy having a melting point of not less than 400° C. and not more than 600° C.

The melting point of the first alloy 6 can be examined using the solidification point of the alloy. The solidification point refers to the temperature at which a liquid becomes a solid. That is, this refers to the temperature at which a bonding brazing material melts to form a liquid phase or cools to form a solid. For simplicity, the solidification point of a compound may be examined using a phase diagram. Also, the melting temperature may be measured by cutting out the bonding layer 4 from the bonded body 1 and by gradually heating.

The melting point of the first alloy 6 can be measured using a DSC curve. The DSC curve is the result of using a differential scanning calorimeter (DSC) to apply heat to a sample and to measure the existence of endothermic reactions and/or exothermic reactions. A peak occurs in the DSC curve when an endothermic reaction or an exothermic reaction occurs. A peak in the negative direction shows the occurrence of an endothermic reaction. A peak in the positive direction shows the occurrence of an exothermic reaction. An endothermic reaction indicates the occurrence of melting, decomposing, etc., of the sample. Also, an exothermic reaction indicates the occurrence of solidification or the formation of a compound (including an alloy) due to the constituent elements of the sample reacting with each other. A larger peak indicates a larger heat of reaction. Here, a peak in the negative direction is called an endothermic peak; and a peak in the positive direction is called an exothermic peak. Also, the apex of a peak is called a peak top. The difference between the maximum point and the minimum point of a peak is called the peak height.

For example, because an endothermic peak is a peak in the negative direction, the DSC curve drops and rises at the endothermic peak vicinity. At the endothermic peak vicinity, maximum point→minimum point→maximum point appears in the DSC curve. The minimum point (the lowest location in the negative direction) is the peak top. Also, among the maximum points at the low-temperature side and high-temperature side of the minimum point, the maximum point that has the largest value is taken to be the highest maximum point (the highest location in the positive direction). The peak height is the value of the minimum point subtracted from the highest maximum point.

Because an exothermic peak is a peak in the positive direction, the DSC curve rises and drops at the exothermic peak vicinity. At the exothermic peak vicinity, minimum point→maximum point→minimum point appears in the DSC curve. The maximum point (the highest location in the positive direction) is the peak top. Also, among the minimum points at the low-temperature side and high-temperature side of the maximum point, the minimum point that has the smallest value is taken to be the lowest minimum point (the lowest location in the negative direction). The peak height is the value of the lowest minimum point subtracted from the maximum point.

There are also cases where the end point of an endothermic peak (a peak in the negative direction) appears to be an exothermic peak (a peak in the positive direction). Herein, such end points also are counted as exothermic peaks. Also, each peak height may be determined by drawing a baseline. Also, a change of not less than 0.02 mW/mg in the vertical axis of the DSC curve is counted as a peak. That is, a change that is less than 0.02 mW/mg is not counted as a peak.

In the DSC curve of the cooling process, it is favorable for an exothermic peak to be detected within the range of greater than 600° C. and not more than 900° C. The exothermic peaks within this range are the major part of the solidification reaction. Also, it is favorable for exothermic peaks to be within the range of not less than 400° C. and not more than 600° C. As described above, an exothermic reaction indicates the occurrence of solidification or the formation of a compound (including an alloy) by the brazing material components reacting with each other. That is, an exothermic peak within the range of not less than 400° C. and not more than 600° C. indicates the occurrence of a solidification reaction or the formation of a compound within the temperature range. Solidification is the reaction accompanying the phase change from liquid to solid. There are also cases where the formation of a compound accompanies a phase change from a solid to a solid having a different crystal structure. The stress when cooling can be relaxed by such a phase change occurring in multiple stages. For a brazing material composition such as that described below, the phase change for forming the compound is the major part of factors causing the occurrence of the exothermic peak. In other words, when the first alloy 6 exists, an exothermic peak can occur within the range of not less than 400° C. and not more than 600° C. of the DSC curve of the cooling process. The reaction that accompanies the phase change can have multiple stages by exothermic peaks existing within the range of not less than 400° C. and not more than 600° C. and the range of greater than 600° C. and not more than 900° C. Here, the temperature at which the phase changes from liquid to solid occurs is called the solidification point. The temperature at which the phase changes to a solid having a different crystal structure occurs is called the phase change point.

When multiple alloys (including compounds) having mutually-different composition ratios exist, the exothermic peaks of the alloys may overlap. In other words, even when only one exothermic peak is detected, multiple alloys (including compounds) having mutually-different composition ratios may exist.

The solidification point is the temperature at which a liquid phase changes to a solid phase. The phase change point is the temperature at which the change to a solid having a different crystal structure occurs. The occurrence temperature of thermal stress can be lowered by the solidification or phase change occurring within the range of 400° C. to 600° C. The solidification point of a conventional AgCu eutectic compound is about 780° C. In the cooling process, the compound that solidifies at 780° C. generates thermal stress until returning to room temperature. The existence of the first alloy 6 of which the solidification point or the phase change point is within the range of 400° C. to 600° C. can reduce the thermal stress after the solidification or phase change at 400° C. to 600° C. until returning to room temperature.

The multiple first alloys 6 also have mutually-different solidification points or phase change points due to the mutually-different composition ratios. The multiple first alloys 6 that have different solidification points or phase change points exist within the range of 400° C. to 600° C. Thereby, the solidification or phase change of the bonding layer can be performed in multiple stages. The thermal stress is further reduced thereby. Thermal stress is generated in the process of the bonding brazing material melting to form a liquid phase, solidifying, and cooling to room temperature. In particular, it is important to reduce the thermal stress from the solidification until being cooled to room temperature. By the solidification or phase change of the first alloy 6 occurring in multiple stages, the thermal stress from the solidification until being cooled to room temperature can be reduced. When the solidification point or phase change point of the first alloy 6 is less than 400° C., there is a possibility that the solidification point or phase change point of the bonding layer 4 may drop, and the temperature cycle test (TCT) characteristics may degrade. When the solidification point or phase change point of the first alloy 6 is high, i.e., greater than 600° C., there is a possibility that the thermal stress may increase. It is therefore favorable for the solidification point or phase change point of the first alloy 6 to be not less than 400° C. and not more than 600° C., and more favorably not less than 450° C. and not more than 550° C. Also, even if exothermic peaks overlap at not less than 400° C. and not more than 600° C. in the DSC curve of the cooling process, the effect of the solidification or the phase change being performed in multiple stages is obtained by the existence of the multiple first alloys 6 having different composition ratios.

Also, it is favorable for the first alloy 6 to include one, two, or more selected from a Cu—Sn compound and a Cu—In compound. In a compound, the constituent elements are bonded to each other at the atomic level. An intermetallic compound is an example of a compound. A solid solution, a eutectic solid, etc., are examples of alloys. A compound is discriminated from a solid solution or a eutectic solid. The phase structure can be identified by the crystal structure and the composition. For example, in a CuSn binary alloy, the alloy is mainly a solid solution when the Sn amount is not more than 9 atomic %. The alloy easily forms an intermetallic compound when the Sn amount is not less than 10 atomic %.

It is favorable for at least a portion of the multiple first alloys 6 to have a Sn content within the range of not less than 3 atomic % and not more than 30 atomic %. The solidification point or the phase change point is easily controlled when the Sn content is within the range of 3 atomic % to 30 atomic %. The solidification point or the phase change point is insufficiently reduced when the Sn amount is less than 3 atomic %. Also, there is a possibility that the solidification point or the phase change point may become too low when the Sn amount is greater than 30 atomic %. It is therefore favorable for the Sn content to be not less than 3 atomic % and not more than 30 atomic %. Also, the first alloy 6 in which the Sn content is not less than 3 atomic % and not more than 30 atomic % easily forms a Cu—Sn compound.

When performing EDX point analysis of a region of the Cu—Sn alloy that is Cu-rich by EDX area analysis, it is favorable for not less than 80% of the region to be a Cu—Sn alloy having a Sn content of not less than 3 atomic % and not more than 30 atomic %. The EDX point analysis is performed at least ten times. A Cu-rich region refers to a region in which there is more Cu when comparing the atomic % of Cu and the atomic % of Ti by EDX area analysis.

Also, the first alloy 6 may include not more than 2 atomic % of metal components other than Cu and Sn. Metal components other than Cu and Sn are metal components or impurities included in the bonding brazing material. As described below, Ti (titanium) and C (carbon) are examples of constituent components of the bonding brazing material other than Cu and Sn. For example, the solidification point of a TiSn alloy is greater than 600° C. When the Ti amount in the Cu—Sn alloy increases, there is a possibility that the solidification point or the phase change point may not be within the range of not less than 400° C. and not more than 600. It is therefore favorable for the Ti amount to be not more than 2 atomic %, and more favorably not more than 1 atomic % in at least a portion of the multiple first alloys 6. EDX point analysis is used to measure the Ti amount in a Cu—Sn compound. Oxygen, nitrogen, etc., are examples of components other than the metal components. The first alloy 6 may include not more than 10 atomic % of components other than Cu, Sn, and the metal components.

When the bonding brazing material includes Ag, a AgCu eutectic solid is easily formed. The melting point of a AgCu eutectic solid is about 780° C. It is therefore favorable not to include Ag as a constituent component of the bonding brazing material. In other words, it is favorable for the bonding layer 4 not to include Ag. There are also cases where Ag—Cu—Sn—Ti that has Ag as a major component is used as the bonding brazing material. When Ag is a major component, AgCu or AgSn is formed. This reduces the ratio of the CuSn alloy included in the bonding layer 4. Therefore, the likelihood of forming Cu—Sn alloys having different compositions decreases. From this perspective as well, it is favorable for the bonding layer 4 not to include Ag.

Favorably, a portion of the multiple first alloys 6 is a Cu—Sn alloy having a Sn amount of not less than 3 atomic % and not more than 9 atomic %; and another portion of the multiple first alloys 6 is a Cu—Sn alloy having a Sn amount of not less than 10 atomic % and not more than 30 atomic %.

Herein, the Cu—Sn alloy that has a Sn amount of not less than 3 atomic % and not more than 9 atomic % is called a first Cu—Sn alloy; and the Cu—Sn alloy that has a Sn amount of not less than 10 atomic % and not more than 30 atomic % is called a second Cu—Sn alloy. It is favorable for the first Cu—Sn alloy to be a Cu—Sn compound. It is favorable for the second Cu—Sn alloy to be a Cu—Sn compound. This is because the solidification or phase change of a compound is easily performed in multiple stages.

It is favorable for the bonding layer 4 to include the second alloy 7. The second alloy 7 includes one or two selected from a Ti—Sn alloy and a Ti—In alloy. The Ti—Sn alloy or the Ti—In alloy may include an intermetallic compound. For example, one, two, or more selected from $SnTi_3$, $Sn_3Ti_5$, and $Sn_5Ti_6$ are examples of intermetallic compounds of the Ti—Sn alloy.

It is favorable for the total surface area of the multiple first alloys 6 to be greater than the total surface area of the second alloy 7 for the average values measured in three locations of the bonding layer 4. In other words, it is favorable for the total surface area of the Cu—Sn alloy or the Cu—In alloy to be greater than the total surface area of the Ti—Sn alloy or the Ti—In alloy. The field area is set to the thickness of the bonding layer×40 μm in the width direction. The measurement of one field area may be divided into multiple measurements. Also, when dividing into multiple measurements, the areas are set not to overlap each other.

Also, it is favorable for the Ti—Sn alloy and at least a portion of the Cu—Sn alloy detected by the EDX point analysis of the bonding layer 4 to be within the region of the ternary phase diagram of Cu, Sn, and Ti surrounded with (97, 3, 0), (60, 40, 0), (2, 40, 58), and (39, 3, 58). Herein, this region is called a first composition region.

Figure 3:
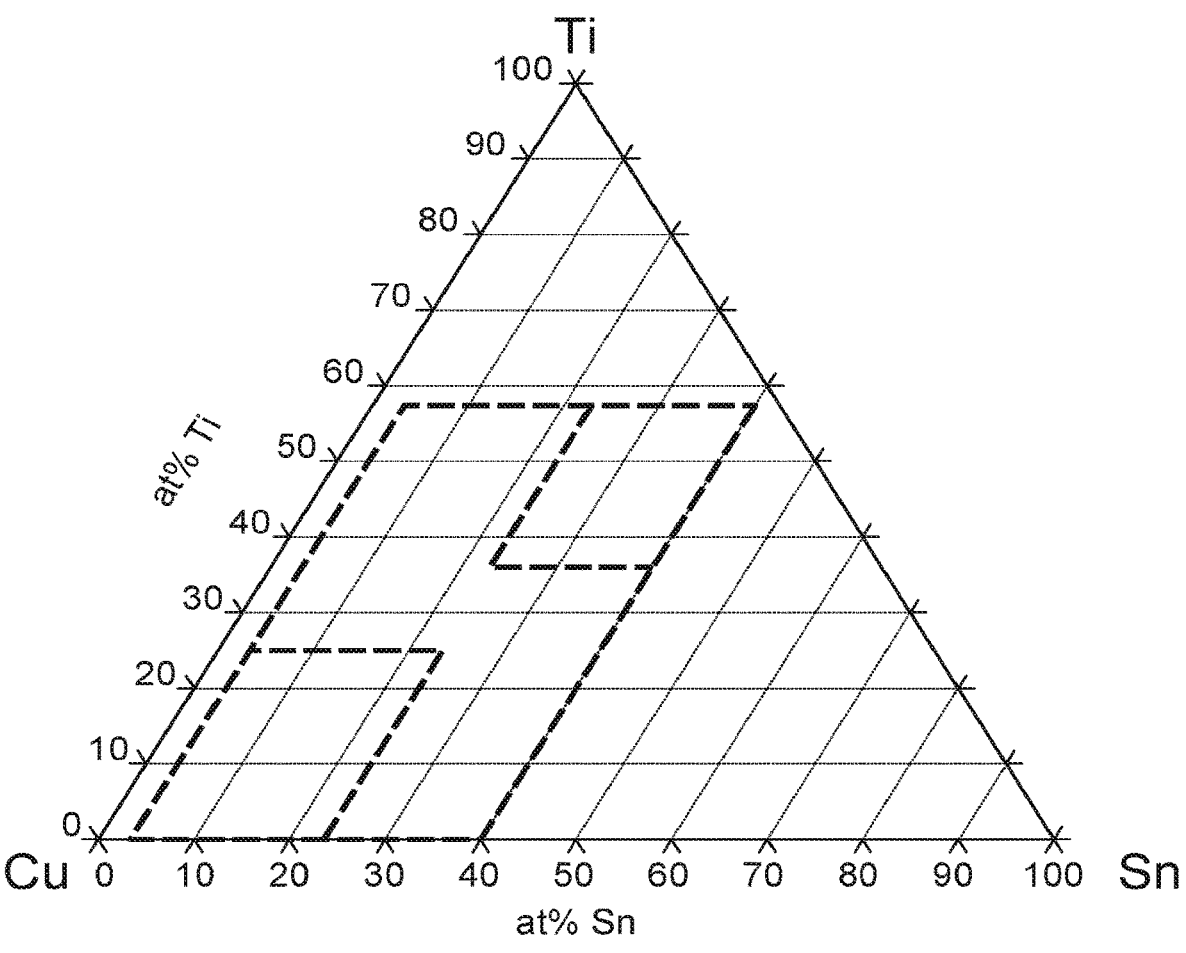
FIG. 3 is a ternary phase diagram showing an example of the composition of a CuSnTi alloy.

FIG. 3 is a ternary phase diagram of Cu, Sn, and Ti. FIG. 3 shows the concentrations of the elements in atomic %.

First image data is obtained by elemental mapping by using the area analysis function of SEM-EDX. EDX point analysis is performed for the locations determined to be the first alloy 6 and the second alloy 7 by the mapping function. According to the elemental mapping, differences of the concentration of the designated element can be indicated by the luminance. A region of high concentration has high luminance, and a region of low concentration has a low luminance. For example, the shading of the Ti concentration can be visualized by designating Ti as the designated element. The first alloy 6 and the second alloy 7 that exist in the field area can be discriminated by using this function. That is, the first alloy 6 that exists in the field area can be discriminated by designating the first element as the designated element and by visualizing the concentrations of these elements. Also, the second alloy 7 that exists in the field area can be discriminated by designating Ti as a designated element and by visualizing the concentrations of these elements. It is favorable for the compositions of the EDX point analysis of the locations discriminated to be the first alloy 6 and the second alloy 7 to be within the range of the first composition region. Although alloys outside the range of the first composition region also may exist, the characteristics can be improved by setting the compositions of the alloys to be within the range of the first composition region.

More favorably, the composition of at least a portion of the Cu—Sn alloy when performing EDX point analysis is within the region of the ternary phase diagram of Cu, Sn, and Ti surrounded with (97, 3, 0), (77, 23, 0), (52, 23, 25), and (72, 3, 25). This region is called a second composition region.

The first alloy 6 that has a composition other than the second composition region also may exist in the bonding layer 4. On the other hand, the characteristics can be further improved when more of the first alloy 6 has the composition of the second composition region. Also, when observing the Cu—Sn alloy by elemental mapping based on SEM-EDX area analysis and then performing EDX point analysis of the Cu—Sn alloy, it is favorable for the composition to be within the range of the second composition region for not less than 80% of the analysis location. In the EDX point analysis, not less than ten points that are separated from each other by not less than 3 μm are analyzed.

It is favorable for the Ti—Sn alloy detected by the EDX point analysis of the bonding layer 4 to be within the region of the ternary phase diagram of Cu, Sn, and Ti surrounded with (41, 23, 36), (24, 40, 36), (2, 40, 58), and (19, 23, 58). This region is called a third composition region. When the bonding layer 4 includes multiple Ti—Sn alloys, it is sufficient for the composition of at least a portion of the multiple Ti—Sn alloys to be within the range of the third composition region. On the other hand, the characteristics can be further improved when more of the Ti—Sn alloy has a composition within the range of the third composition region. Also, when observing the Ti—Sn alloy by elemental mapping based on SEM-EDX area analysis and then performing EDX point analysis of the Ti—Sn alloy, it is favorable to have a composition within the range of the third composition region for not less than 80% of the analysis location. In the EDX point analysis, not less than ten points separated from each other by not less than 3 μm are analyzed.

It is favorable for the Ti reaction layer 5 to include titanium nitride grains having an average grain size of not more than 50 nm. Also, it is favorable for Cu and the first element to exist at the grain boundaries of the titanium nitride grains. The size of the titanium nitride grains in the Ti reaction layer 5 is analyzed by a scanning transmission electron microscope (STEM). An enlarged photograph of the bonding layer cross section is obtained by STEM. The distance between the two most distant points on the outer edge of a titanium nitride grain visible in the enlarged photograph is used as the grain size. The grain size is measured for any thirty grains. The average value of the grain sizes is used as the average grain size. Cu and the first element easily enter the grain boundaries when the average grain size is small, i.e., not more than 50 nm. By Cu and the first element existing at the grain boundaries of the titanium nitride grains, the solidification or phase change of the bonding layer 4 can be further caused to occur in multiple stages.

It is favorable for the Cu amount in the Ti reaction layer 5 to be within the range of not less than 0.5 atomic % and not more than 5 atomic %. When the Cu amount in the Ti reaction layer 5 is in this range, the thermal stress can be reduced without reducing the bonding strength. When the Cu amount in the Ti reaction layer 5 is less than 0.5 atomic %, there is a possibility that the Cu amount may be too low, and the reduction effect of the thermal stress may not be sufficiently obtained. When the Cu amount is high, i.e., greater than 5 atomic %, there is a possibility that the strength of the Ti reaction layer 5 may be insufficient, and the bonding strength may be reduced.

It is favorable for the amount of the first element in the Ti reaction layer 5 to be not less than 0.05 atomic % and not more than 2 atomic %. When the amount of the first element in the Ti reaction layer 5 is in this range, the thermal stress can be reduced without reducing the bonding strength. Also, the Cu and the Sn in the Ti reaction layer 5 are easily alloyed. The occurrence of the thermal stress can be suppressed by the Cu and the Sn in the Ti reaction layer 5 being an alloy (favorably a compound). The amount of the Cu and the first element in the Ti reaction layer 5 refers to the amount existed at the grain boundaries of the titanium nitride grains.

Both TiN and $Ti_2N$ may exist as titanium nitride in the Ti reaction layer 5. By both TiN and $Ti_2N$ existing, the solidification of the layer including titanium nitride as a major component can be further caused to occur in multiple stages. It is favorable for the thickness of the Ti reaction layer 5 to be not more than 1 $\mu$m. More favorably, the thickness of the Ti reaction layer 5 is not more than 0.3 $\mu$m. By making the Ti reaction layer 5 thin, Cu and the first element can easily exist at the grain boundaries.

Also, analysis of the thickness of the Ti reaction layer 5 can be performed by a transmission electron microscope (TEM). The thickness of the Ti reaction layer 5 is measured using the interface between the Ti reaction layer 5 and the ceramic substrate as a reference. TEM-EDX is used for the composition analysis of the Ti reaction layer 5.

It is favorable for the average value of the total surface areas of the first alloy 6 of EDX area analysis of three regions of the bonding layer 4 to be not less than 50% and not more than 95% of the surface area of each of the three regions. The field area (the size of one region) is set to the bonding layer thickness×40 $\mu$m in the width direction. The thermal stress of the bonding layer 4 can be reduced by the total area ratio of the Cu—Sn alloy being within the range of not less than 50% and not more than 95%. When the total area ratio of the Cu—Sn alloy is less than 50%, there is a possibility that the effect of reducing the thermal stress may be insufficient because the existence ratio of the Cu—Sn alloy is low. Also, when the total area ratio of the Cu—Sn alloy is high, i.e., greater than 95%, there is a possibility that the solidification point or phase change point of the bonding layer 4 may be too low. When the solidification point or phase change point of the bonding layer 4 drops, there is a possibility that the TCT characteristics of the bonded body 1 may degrade. It is therefore favorable for the total area ratio of the Cu—Sn alloy to be not less than 50% and not more than 95%, and more favorably not less than 70% and not more than 90%. Also, it is favorable for the total surface area of the Cu—Sn alloy to be within the range of not less than 50% and not more than 95% regardless of which of three regions is measured in the bonding layer 4.

It is favorable for the average values of the total surface areas of the Ti—Sn alloy of EDX area analysis of three regions of the bonding layer 4 to be within the range of not less than 5% and not more than 30% of the surface area of each of the three regions. It is favorable for the total surface area of titanium silicide to be within the range of not less than 0.5% and not more than 15% of the surface area of each of the three regions. Also, it is favorable for the area ratio of the other material structures to be within the range of not more than 10%. The Ti reaction layer, a carbide, etc., are examples of the other material structures.

To measure the area ratio, the area analysis function of SEM-EDX is used, and image data is obtained by elemental mapping. The mapping function included in the SEM-EDX area analysis function is used. When a mapping function is not included, an electron probe microanalyzer (EPMA) may be used. Also, processing of the image data obtained by SEM-EDX may be performed using image analysis software. Image-J or equivalent software can be used as the image analysis software.

The field area is set to the bonding layer thickness×40 $\mu$m in the width direction. The measurement conditions of the area analysis are as described above. The area ratio is calculated using an elemental map obtained by area analysis. The pinning size of the elemental map is set to 5×5 bit/point. Binarization processing is performed when using image analysis software such as Image-J, etc.

The approach of binarization processing is as follows.

First, the surface area of an element x to be detected is taken as Sx. Sx=((number of pixels of the extraction region of the binarization of the x element)/(total number of pixels of the image))×100 can be determined. The surface area of each element x can be determined by replacing the element x to be detected with Ti, Si, N, and C.

For example, the area ratio of the Ti—Sn alloy can be determined as follows. As described above, the Ti amount is not less than 0 atomic % and not more than 25 atomic % in the second composition region of the Cu—Sn alloy (the first alloy 6). Therefore, the regions in which the Ti amount is not more than 25 atomic % are excluded. The elemental map shows the luminance corresponding to the Ti concentration. The regions in which the Ti amount is not more than 25 atomic % can be excluded using this function. The surface area of the Ti element and the surface area of the Si element are measured by binarizing the image of the elemental map in which the regions in which the Ti amount is not more than 25 atomic % are excluded. The surface area of the Ti—Sn alloy is taken as $S_{Sn-Ti}$, the surface area of the Ti element is taken as $S_{Ti}$; the surface area of the Si element is taken as $S_{Si}$; the surface area of the N element is taken as $S_N$; and the surface area of the C element is taken as Sc. The surface area of the Ti—Sn alloy can be determined by $S_{Sn-Ti}=S_{Ti}-(S_{Si}+S_N+S_C)$. The Si that exists in the bonding layer is titanium silicide. The N (nitrogen) that exists in the bonding layer is titanium nitride. Silicon nitride also is undesirably detected when the boundary between the silicon nitride substrate surface and the bonding layer is wavy. Also, the C (carbon) that exists in the bonding layer is carbon alone or titanium carbide. $S_{Ti}$, $S_{Si}$, $S_N$, and $S_C$ may be calculated using images in which binarization is performed for the mapping image of Ti, Si, N, and C one at a time.

The area ratio of the Cu—Sn alloy is taken as $S_{Cu-Sn}$. $S_{Cu-Sn}$ can be determined by excluding $S_{Si}$, $S_N$, and $S_C$ from the regions in which the Ti amount is not less than 0 atomic % and not more than 25 atomic %.

There are also cases where the Ti element is included in both of the Cu—Sn alloy and the Ti—Sn alloy. The Cu—Sn alloy and the Ti—Sn alloy can be subdivided using a Ti amount of 25 atomic % as a reference. The bonding layer 4 also may include carbon. The carbon that exists in the bonding layer 4 may be carbon alone or may be a carbide. The fluidity of the bonding brazing material can be controlled by adding carbon. The distribution of the Cu—Sn alloy in the bonding layer is easily controlled thereby.

Titanium nitride (TiN), a Ti—Sn alloy, and titanium silicide are examples of materials other than the Cu—Sn alloy existing in the bonding layer 4. Also, when carbon is included, titanium carbide (TiC) may exist. Also, the components that are included in the bonding layer 4 may exist as simple metals. The alloys and the simple metals can be discriminated using a TEM electron diffraction image.

It is favorable for the bonding layer 4 to include the titanium silicide grain 8 having a major diameter of not less than 0.5 μm and not more than 6 μm. When the field area of the bonding layer 4=bonding layer thickness×200 μm in a width direction, it is favorable for the total surface area of the titanium silicide grain 8 having the major diameter of not less than 0.5 μm and not more than 6 μm to be not less than 1% and not more than 15% of the field area.

A SEM photograph is used to measure the major diameter of the titanium silicide grain 8. The distance between the two most distant points on the outer edge of the titanium silicide grain 8 visible in an enlarged photograph of the bonding layer 4 cross section is used as the major diameter. The titanium silicide grain 8 that exists in the bonding layer 4 can be discriminated by the mapping function included in the area analysis function of SEM-EDX. Specifically, Ti and Si are designated as designated elements, and the existence of these elements is visualized. Regions in which both Ti and Si exist correspond to the titanium silicide grains 8.

When the titanium silicide grains 8 exist, it is favorable for not less than 80% and not more than 100% of the titanium silicide grains 8 to exist in locations within 1 μm of the Ti reaction layer 5. Titanium silicide grains are formed when Ti that is not part of the Ti reaction layer 5 or the Ti—Sn alloy reacts with the silicon nitride substrate. Cu and the first element easily enter the grain boundaries of the titanium nitride grains when the titanium silicide grains 8 exist proximate to the Ti reaction layer 5.

There is a possibility that the formation of the Ti reaction layer 5 may be insufficient when the major diameter of the titanium silicide grains 8 is greater than 6 μm or when the area ratio is greater than 15%.

It is favorable for the thickness of the bonding layer 4 to be not less than 5 μm and not more than 60 μm. The area ratio of the Cu—Sn alloy is easily controlled when the thickness is within this range. The thickness of the bonding layer 4 is the distance from the boundary between the ceramic substrate 2 and the Ti reaction layer 5 to the boundary between the bonding layer 4 and the copper plate 3.

The concentration (atomic %) of the first element at the boundary between the bonding layer 4 and the copper plate 3 is taken as a first concentration C1. The concentration (atomic %) of the first element in the region in the copper plate 3 separated 10 μm from the boundary between the bonding layer 4 and the copper plate 3 is taken as a second concentration C2. It is favorable for the ratio C2/C1 of the second concentration C2 to the first concentration C1 to be not more than 0.60.

Also, the concentration (atomic %) of the first element in the region in the copper plate 3 separated 20 μm from the boundary between the bonding layer 4 and the copper plate 3 is taken as a third concentration C3. It is favorable for a ratio C3/C1 of the third concentration C3 to the first concentration C1 to be not more than 0.40. When a pure copper plate is used as the copper plate 3, the second concentration C2 and the third concentration C3 indicate the diffusion amount of the first element into the copper plate 3.

When the bonding layer 4 uses Sn, the Sn concentration is used as the concentration of the first element. When the bonding layer 4 uses In, the In concentration is used as the concentration of the first element. When the bonding layer 4 uses both Sn and In, the total of the Sn concentration and the In concentration is used as the concentration of the first element.

For example, when the bonding layer 4 includes a Cu—Sn alloy, the first concentration is notated as $C1_{Sn}$, the second concentration is notated as $C2_{Sn}$, and the third concentration is notated as $C3_{Sn}$. The diffusion of Sn into the copper plate is suppressed when $C2_{Sn}/C1_{Sn}\leq0.60$ or $C3_{Sn}/C1_{Sn}\leq0.40$.

The diffusion amount of the first element into the copper plate 3 can be reduced by causing the first alloys 6 having mutually-different composition ratios to exist in the bonding layer 4. Also, it is favorable for the diffusion distance of the first element from the boundary to be not more than 50 μm. The diffusion region refers to the distance from the boundary to the point at which the Sn amount becomes 0 mass % (below the detection limit). Also, as described below, the first concentration can be not more than 8 atomic %% in a bonding method using a continuous furnace. The second concentration C2 and the third concentration C3 in the copper plate 3 are analyzed by EDX. Line analysis is used in the analysis.

The heat resistance of the copper plate 3 can be improved by reducing the diffusion amount of Sn into the copper plate 3. For example, a CuSn alloy is formed in the copper plate when Sn diffuses into the copper plate 3. Compared to a copper plate, a CuSn alloy has a low melting point. Therefore, the copper plate is easily deformed by heat when the CuSn alloy in the copper plate increases. There is a possibility that the TCT characteristics of the bonded body may degrade. Although Sn is used in the description here, this is similar for In as well.

By using the configuration described above, the void amount in the bonding layer can be reduced. By reducing the Sn diffusion amount (or the In diffusion amount) into the copper plate, the void amount in the bonding layer can have a volume ratio of not less than 0% and not more than 3%. Ultrasonic inspection (SAT) is used to calculate the void amount in the bonding layer. A flaw inspection probe is caused to contact the surface of the bonded body 1; and an ultrasonic wave is transmitted toward the bonding layer 4. The voids that exist in the bonding layer can be examined based on the reception result of the reflected wave. Also, the volume ratio of the void amount can be calculated based on the reception result. The bonding strength of the copper plate can be increased by reducing the void amount in the bonding layer. The bonding strength is measured using a peel test. The bonding strength of the copper plate can be not less than 15 kN/mm, or even not less than 25 kN/mm.

Such a bonded body is favorable for a ceramic circuit substrate.

Figure 4:
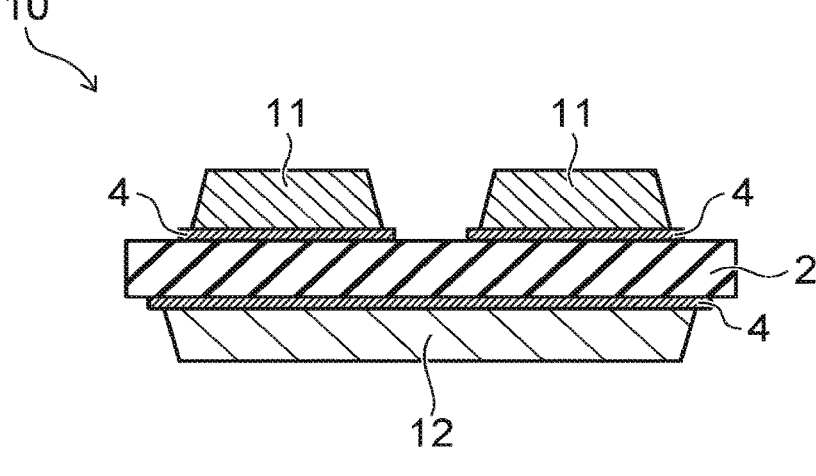
FIG. 4 is a schematic view showing an example of a ceramic circuit substrate according to the embodiment.

FIG. 4 is a schematic view showing an example of a ceramic circuit substrate according to the embodiment. In FIGS. 4, 10 is a ceramic circuit substrate, 11 is a circuit part, and 12 is a heat dissipation plate. The ceramic circuit substrate 10 shown in FIG. 4 is made by patterning the copper plate 3 on the front side of the bonded body 1 into the circuit part 11 and patterning the copper plate 3 on the backside into the heat dissipation plate 12. The copper plate 3 that is provided with the circuit configuration is used as the circuit part 11. Two circuit parts 11 are included in FIG. 4. The ceramic circuit substrate 10 according to the embodiment is not limited to such a structure. As necessary, the number and sizes of the circuit parts 11 are modifiable appropriately. Also, although the copper plate 3 on the backside is used as the heat dissipation plate 12 in FIG. 4, circuit structures may be provided in the copper plates 3 at two surfaces. The side surface of the circuit part 11 or the side surface of the heat dissipation plate 12 may be provided with inclined shapes as necessary. A jutting part that juts from the side surface edge of the circuit part 11 may be provided in the bonding layer 4 between the ceramic substrate 2 and the circuit part 11 as necessary. A jutting part that juts from the side surface edge of the heat dissipation plate 12 may be provided in the bonding layer 4 between the ceramic substrate 2 and the heat dissipation plate 12. It is favorable to use an etching process to provide the circuit structure and provide the inclined shape in the copper plate side surface.

The ceramic circuit substrate according to the embodiment is favorable for a semiconductor device.

Figure 5:
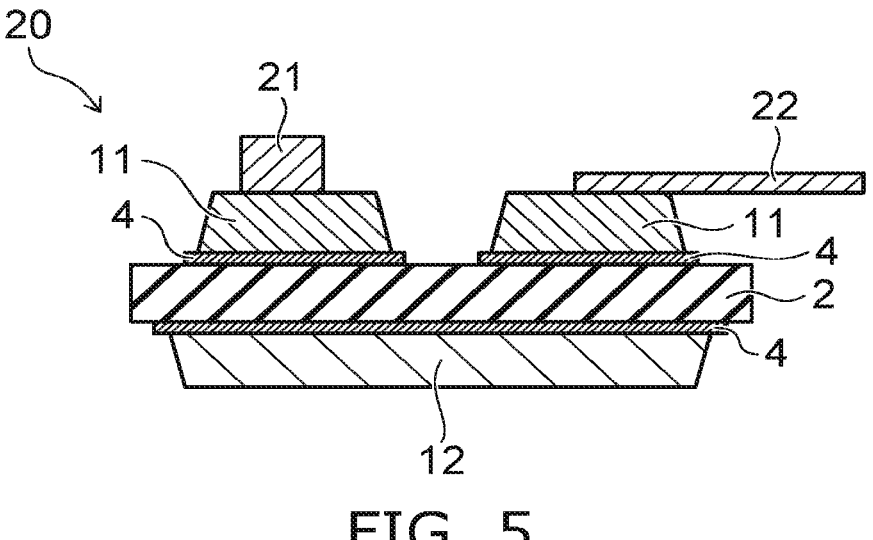
FIG. 5 is a schematic view showing an example of a semiconductor device according to the embodiment.

FIG. 5 is a schematic view showing an example of a semiconductor device according to the embodiment. In FIGS. 5, 20 is a semiconductor device, 21 is a semiconductor element, and 22 is a leadframe. In the semiconductor device 20 shown in FIG. 5, the semiconductor element 21 is mounted to one of the two circuit parts 11. The leadframe 22 is connected to the other of the two circuit parts 11. The semiconductor device 20 according to the embodiment is not limited to such a structure. As necessary, the number and sizes of the circuit parts 11, the number and sizes of the semiconductor elements 21, etc., are modifiable as appropriate.

A method for manufacturing the bonded body according to the embodiment will now be described. The manufacturing method is not limited as long as the bonded body according to the embodiment has the configuration described above. An example of a method for obtaining the bonded body with a high yield will now be described.

First, the ceramic substrate 2 is prepared. A silicon nitride substrate, an aluminum nitride substrate, an aluminum oxide substrate, an Alusil substrate, etc., are examples of the ceramic substrate 2. An Alusil substrate is a substrate formed by mixing aluminum oxide and zirconium oxide.

A pure copper plate or a copper alloy plate can be used as the copper plate 3. It is favorable for the copper plate to be oxygen-free copper. Oxygen-free copper is copper that has a purity of not less than 99.96 mass % as indicated in JIS-H-3100.

Then, a bonding brazing material is prepared. It is favorable for the bonding brazing material to include not less than 50 atomic % Cu, not less than 5 atomic % and not more than 40 atomic % Ti, not less than 2 atomic % and not more than 35 atomic % of the first element, and not less than 0 atomic % and not more than 12 atomic % carbon. These are the ratios when the total of Cu, Ti, the first element, and C is taken to be 100 atomic %. Ti may be added as titanium hydride ($TiH_2$). It is effective not to Ag add to the bonding brazing material.

It is favorable to pre-examine the characteristics of the bonding brazing material used to manufacture the bonded body by using DSC. The DSC curve of the bonding brazing material is measured by setting the heating rate in the heating process to 20° C./minute and the cooling rate in the cooling process to 20° C./minute.

The TGA-DSC simultaneous thermal analyzer STA449-F3-Jupiter made by NETZSCH or an apparatus having equivalent performance is used as the DSC. The measurement is performed in an Ar (argon) flow by dropping an appropriate amount of the brazing material into an alumina container. The measurement is performed by closing the lid of the alumina container. It is necessary to prevent the brazing material and the atmosphere from reacting by measuring in an Ar atmosphere. The dropped amount (mg) is premeasured using a balance. A sample of not less than 15 mg is used.

In the heating process, the temperature is raised from room temperature to 950° C. at a heating rate of 20° C./minute. Then, a holding process of holding at 950° C. for 20 minutes is performed. In the cooling process, the temperature is lowered from 950° C. to room temperature at a cooling rate of 20° C./minute. The temperature profile for determining the DSC curve is made of the heating process, the holding process, and the cooling process. Hereinbelow, the DSC curve of a cooling process having a cooling rate of 20° C./minute is also called the DSC curve of the cooling process. Also, heat flux that has a difference of not less than 0.02 mW/mg is taken to be a peak.

When the first alloy 6 that has a solidification point or a phase change point at not less than 400° C. and not more than 600° C. exists, an exothermic peak is detected within the range of not less than 400° C. and not more than 600° C. of the DSC curve of the cooling process. When multiple exothermic peaks are detected between 400° C. to 600° C. in the DSC curve of the cooling process, the temperature at which the largest peak occurs is used as the solidification point or phase change point of the bonding layer 4.

It is favorable for an average grain size $D_{50}$ of the Cu powder used as the raw material of the brazing material to be not more than 12.0 μm, and more favorably not more than 10.0 μm. It is favorable for the average grain size $D_{50}$ of the Ti powder or the $TiH_2$ powder to be not more than 6.0 μm, and more favorably not more than 4.0 μm. It is favorable for the average grain size $D_{50}$ of the Sn powder or the In powder to be not more than 16.0 μm, and more favorably not more than 14.0 μm. It is favorable for the average grain size $D_{50}$ of the C powder to be not more than 6.0 μm, and more favorably not more than 4.0 μm. It is favorable for the average grain size $D_{50}$ of the Ag powder to be not more than 3.0 μm, and more favorably not more than 2.0 μm. By controlling the grain sizes of the powders, the reactions of the powders can be made uniform.

It is favorable for the average grain size $D_{50}$ of the Cu powder to be less than the average grain size $D_{50}$ of the Sn powder or the In powder. As described above, Cu and the first element are the base material of the brazing material composition. Compared to Cu, the melting point of the first element is low. By increasing the grain size of the Sn powder or the In powder, the reactions of the Cu powder and the powder of the first element can be made uniform. Thereby, the ceramic substrate 2 and the copper plate 3 can be sufficiently bonded even when the heating rate or the cooling rate is increased.

A process of bonding the ceramic substrate and the copper plate is performed using a bonding brazing material such as that described above. A brazing material paste is prepared by mixing the bonding brazing material with an organic substance. A brazing material paste layer is formed by coating the brazing material paste onto the surface of the ceramic substrate 2 (or the copper plate 3). The copper plate 3 (or the ceramic substrate 2) is located on the brazing material paste layer.

The thermal bonding process is performed in a nitrogen atmosphere. A nitrogen atmosphere is an atmosphere in which nitrogen is not less than 70 vol %. It is favorable for the nitrogen amount of the nitrogen atmosphere to be not less than 70 vol %, and more favorably not less than 85 vol % and not more than 100 vol %. An inert gas or ambient air is an example of a component other than nitrogen in the nitrogen atmosphere. The thermal bonding in the nitrogen atmosphere can be performed using various conditions such as atmospheric pressure, depressurized, pressurized, etc.

In the heating process of the thermal bonding process, the heating rate is set to be not less than 30° C./minute. Although the upper limit of the heating rate is not particularly limited, it is favorable to be not more than 100° C./minute. When the heating rate is fast, i.e., greater than 100° C./minute, there is a possibility that the bondability may degrade. It is therefore favorable for the heating rate to be not less than 30° C./minute and not more than 100° C./minute, and more favorably not less than 40° C./minute and not more than 70° C./minute.

The bonding temperature is set to be not less than 750° C. It is favorable for the bonding temperature to be not more than 1000° C. When the bonding temperature is high, i.e., greater than 1000° C., the bonding temperature approaches the melting point of copper (1085° C.). As a result, there is a possibility that the copper plate may deform. It is therefore favorable for the bonding temperature to be not less than 750° C. and not more than 1000° C., and more favorably not less than 800° C. and not more than 950° C.

In the thermal bonding process, the bonding temperature can be held for not less than 10 minutes. The time of holding at the bonding temperature is called the heating holding time. It is favorable for the heating holding time to be not less than 10 minutes and not more than 100 minutes. When the heating holding time is less than 10 minutes, there is a possibility that the time for the brazing material to melt and solidify may be insufficient. When the heating holding time is long, i.e., greater than 100 minutes, there is a possibility that the control of the distribution of the alloy in the bonding layer 4 may be difficult.

The cooling process is performed after the heating holding time has ended. The cooling process is a process of cooling from the bonding temperature to room temperature. The cooling rate is set to be not less than 30° C./minute. In conventional active metal bonding, the cooling rate is about 5° C./minute. By using a bonding brazing material having a DSC curve such as that described above, bonding is possible even when the cooling rate is increased. Although the upper limit of the cooling rate is not particularly limited, it is favorable to be not more than 100° C./minute. When fast, i.e., greater than 100° C./minute, there is a possibility that the bondability may degrade. It is therefore favorable for the cooling rate to be not less than 30° C./minute and not more than 100° C./minute, and more favorably not less than 30° C./minute and not more than 70° C./minute. Also, to increase the heating rate and/or the cooling rate, it is favorable to use a continuous furnace. A continuous furnace can perform heat treatment in a nitrogen atmosphere. The heating rate and the cooling rate can be increased because it is unnecessary to pull a vacuum.

By increasing the cooling rate, the distribution of the Cu—Sn alloy in the bonding layer 4 can be controlled. This is because an alloy that corresponds to the solidification point or the phase change point can be formed by quickly cooling after the bonding brazing material melts. Also, by providing Ti that does not become the Ti reaction layer 5, a Ti—Sn alloy and titanium silicide grains can be formed. A quick temperature reduction can suppress unnecessary diffusion phenomena into the copper plate.

It is favorable for the difference between the heating rate and the cooling rate to be not more than 20° C./minute. That is, it is favorable to satisfy heating rate-cooling rate 20° C./minute. Melting reactions and solidification reactions in the brazing material layer are caused by heating. These reactions occur in the heating process and the cooling process. By reducing the difference between the heating rate and the cooling rate, the stress that occurs in the reactions can be made uniform. Discrepancies such as warp, etc., can be suppressed thereby.

As necessary, the thermal bonding process may be performed with a weight placed on the bonded body 1.

The bonded body 1 can be made by bonding processes such as those described above. Also, the warp of the bonded body 1 can be reduced because the thermal stress of the bonding layer 4 can be reduced.

The bonded body 1 that is obtained is patterned into the ceramic circuit substrate 10 by etching. Multi-part manufacturing may be performed by scribing the bonded body 1 as necessary.

EXAMPLES

Examples 1 to 8 and Comparative Example 1

Bonding brazing materials shown in Tables 1 and Table 2 were prepared. Table 1 shows the grain sizes of the raw material powders; and Table 2 shows the composition ratios.

TABLE 1

| | Average grain size $D_{50}$ (µm) | | | | |
| --- | --- | --- | --- | --- | --- |
| | Cu powder | Su powder | $TiH_2$ powder | C powder | Ag powder |
| Example 1 | 8.8 | 12.8 | 2.2 | — | — |
| Example 2 | 7.9 | 11.0 | 1.8 | 0.8 | — |
| Example 3 | 6.8 | 10.7 | 1.7 | 1.4 | — |
| Example 4 | 9.8 | 13.8 | 3.5 | 1.2 | — |
| Example 5 | 5.2 | 15.2 | 2.8 | — | — |
| Example 6 | 6.6 | 13.1 | 2.6 | 1.0 | — |
| Example 7 | 7.7 | 11.5 | 1.5 | 1.0 | — |
| Example 8 | 7.9 | 12.0 | 1.8 | 1.0 | — |
| Comparative example 1 | 8.9 | 12.7 | 3.2 | — | 2.8 |

TABLE 2

| | Composition ratio (atomic %) | | | | |
| --- | --- | --- | --- | --- | --- |
| | Cu powder | Su powder | $TiH_2$ powder | C powder | Ag powder |
| Example 1 | 59.8 | 35.1 | 5.1 | — | — |
| Example 2 | 67.9 | 27.4 | 3.7 | 1.0 | — |
| Example 3 | 70.9 | 19.1 | 6.4 | 3.6 | — |
| Example 4 | 50.2 | 41.5 | 7.8 | 0.5 | — |
| Example 5 | 70.4 | 25.4 | 4.2 | — | — |
| Example 6 | 53.7 | 38.0 | 7.8 | 0.5 | — |

TABLE 2-continued

| | Composition ratio (atomic %) | | | | |
|---|---|---|---|---|---|
| | Cu powder | Su powder | TiH$_2$ powder | C powder | Ag powder |
| Example 7 | 68.0 | 24.6 | 6.9 | 0.5 | — |
| Example 8 | 56.0 | 35.6 | 7.3 | 0.5 | — |
| Comparative example 1 | 52.8 | 8.2 | 2.0 | — | 37.0 |

Brazing material pastes were made by mixing the bonding brazing material components according to the examples and the comparative examples with an organic binder. The DSC curves of the brazing material pastes were measured using a differential scanning calorimeter.

The TGA-DSC simultaneous thermal analyzer STA449-F3-Jupiter made by NETZSCH was used as the DSC. The measurement was performed in an Ar flow by dropping an appropriate amount of the brazing material into an alumina container. The temperature program was set to include a heating rate of 20° C./minute, holding at 950° C.×20 minutes, and a cooling rate of 20° C./minute.

The temperature at which the exothermic peak was detected in the DSC curve of the cooling process was measured. Table 3 shows the temperature at which the largest peak among the exothermic peaks that appeared at not less than 400° C. and not more than 600° C. in the DSC curve of the cooling process.

TABLE 3

| | DSC curve (peak top temperature ° C.) Cooling process |
|---|---|
| Example 1 | 522 |
| Example 2 | 534 |
| Example 3 | 551 |
| Example 4 | 518 |
| Example 5 | 572 |
| Example 6 | 552 |
| Example 7 | 543 |
| Example 8 | 526 |

TABLE 3-continued

| | DSC curve (peak top temperature ° C.) Cooling process |
|---|---|
| Comparative example 1 | 753 |

It can be seen from Table 3 that the temperature of the exothermic peak in the cooling process of the DSC curve was within the range of not less than 400° C. and not more than 600° C. for the bonding brazing materials according to the examples. Conversely, in the comparative example 1, the temperature of the exothermic peak was greater than 600° C. An exothermic peak was not detected within the range of not less than 400° C. and not more than 600° C. Furthermore, an exothermic peak was detected also within the range of greater than 600° C. and not more than 900° C. for the bonding brazing materials according to the examples.

Then, a silicon nitride substrate was prepared as a ceramic substrate. A silicon nitride substrate was used as the silicon nitride substrate 1, and had a thermal conductivity of 90 W/m·K and a three-point bending strength of 600 MPa, and was 300 mm long×200 mm wide×0.32 mm plate thickness. Also, a silicon nitride substrate was used as the silicon nitride substrate 2, and had a thermal conductivity of 85 W/m·K and a three-point bending strength of 650 MPa, and was 300 mm long×200 mm wide×0.25 mm plate thickness.

Oxygen-free copper that was 300 mm long×200 mm wide×0.5 mm plate thickness was used as the copper plate 1. Oxygen-free copper that was 300 mm long×200 mm wide×0.8 mm plate thickness was used as the copper plate 2. 30 μm of brazing material paste was coated onto the two surfaces of the ceramic substrate, and copper plates were provided respectively on the surfaces.

Then, a thermal bonding process was performed. The bonding atmosphere was unified to a nitrogen atmosphere. Also, the bonding conditions were within the range of 850° C. to 920° C.×30 minutes to 50 minutes, and a continuous furnace was used. The heating rate and the cooling rate were set to the conditions shown in Table 4. The difference between the heating rate and the cooling rate was calculated by |heating rate-cooling rate|.

TABLE 4

| | Ceramic substrate | Front copper plate | Back copper plate | Heating rate (° C./min) | Cooling rate (° C./min) | Difference between heating rate and cooling rate (° C./min) |
|---|---|---|---|---|---|---|
| Example 1 | Silicon nitride substrate 1 | Copper plate 2 | Copper plate 2 | 40 | 40 | 0 |
| Example 2 | Silicon nitride substrate 2 | Copper plate 1 | Copper plate 1 | 50 | 50 | 0 |
| Example 3 | Silicon nitride substrate 1 | Copper plate 1 | Copper plate 1 | 60 | 60 | 0 |
| Example 4 | Silicon nitride substrate 2 | Copper plate 2 | Copper plate 2 | 30 | 50 | 20 |
| Example 5 | Silicon nitride substrate 1 | Copper plate 1 | Copper piste 1 | 20 | 70 | 50 |
| Example 6 | Silicon nitride substrate 2 | Copper plate 2 | Copper plate 2 | 80 | 80 | 0 |
| Example 7 | Silicon nitride substrate 2 | Copper plate 2 | Copper plate 2 | 90 | 90 | 0 |
| Example 8 | Silicon nitride substrate 2 | Copper Plate 2 | Copper plate 2 | 90 | 90 | 0 |
| Comparative example 1 | Silicon nitride substrate 1 | Copper plate 1 | Copper plate 1 | 20 | 20 | 0 |

The bonded body was manufactured by the processes described above. A bonding layer cross section of the obtained bonded body was observed, and the existence or absence of Cu—Sn alloys having different composition ratios, the average grain size of titanium nitride in the Ti reaction layer, and the Cu and Sn amounts in the Ti reaction layer were examined. Also, when Cu—Sn alloys having different composition ratios existed, the existence or absence of the first Cu—Sn alloy having a Sn amount of not less than 3 atomic % and not more than 9 atomic % and the existence or absence of the second Cu—Sn alloy having a Sn amount of not less than 10 atomic % and not more than 30 atomic % were examined.

Also, the area ratio of the Cu—Sn alloy and the area ratio of the Ti—Sn alloy were examined. Also, the major diameter and the area ratio of titanium silicide were examined. A method of binarizing the EDX elemental map with image software was used to calculate the area ratio. The detailed methods are as described above. The results are shown in Tables 5 to 8.

TABLE 5

| | Cu—Sn alloy | | | |
|---|---|---|---|---|
| | Existence or absence of composition ratio difference | Existence or absence of first Cu—Sn alloy | Existence or absence of second Cu—Sn alloy | Ti content not more than 1 at %? |
| Example 1 | Yes | Yes | Yes | Yes |
| Example 2 | Yes | Yes | Yes | Yes |
| Example 3 | Yes | Yes | Yes | Yes |
| Example 4 | Yes | Yes | Yes | Yes |
| Example 5 | Yes | Yes | Yes | Yes |
| Example 6 | Yes | Yes | Yes | Yes |
| Example 7 | Yes | Yes | Yes | Yes |
| Example 3 | Yes | Yes | Yes | Yes |
| Comparative example 1 | No | No | No | No |

TABLE 6

| | Layer including titanium nitride as major component | | | |
|---|---|---|---|---|
| | Thickness (μm) | Average grain size of titanium nitride grain (nm) | Cu content 0.5 to 5 at %? | Sn content 0.05 to 2 at %? |
| Example 1 | 0.2 | 32 | Yes | Yes |
| Example 2 | 0.3 | 27 | Yes | Yes |
| Example 3 | 0.3 | 26 | Yes | Yes |
| Example 4 | 0.4 | 38 | Yes | Yes |
| Example 5 | 0.2 | 31 | Yes | Yes |
| Example 6 | 0.2 | 25 | Yes | Yes |
| Example 7 | 0.1 | 23 | Yes | Yes |
| Example 8 | 0.2 | 23 | Yes | Yes |
| Comparative example 1 | 2.7 | 84 | No | No |

TABLE 7

| | Titanium silicide | | |
|---|---|---|---|
| | Existence or absence of titanium silicide having major diameter of 0.5 to 6 μm | Major diameter average value (μm) | Number percentage not less than 80% within 1 μm from Ti reaction layer? |
| Example 1 | Yes | 2.5 | Yes |
| Example 2 | Yes | 1.8 | Yes |
| Example 3 | Yes | 2.2 | Yes |
| Example 4 | Yes | 2.8 | Yes |
| Example 5 | Yes | 2.3 | No |
| Example 6 | Yes | 1.9 | Yes |
| Example 7 | Yes | 1.7 | Yes |
| Example 8 | Yes | 1.7 | Yes |
| Comparative example 1 | No | — | No |

TABLE 8

| | Existence or absence of carbon in bonding layer | Area ratio (%) | | | |
|---|---|---|---|---|---|
| | | Cu—Sn alloy | Ti—Sn alloy | Titanium silicide | Other |
| Example 1 | Yes | 71 | 11 | 12 | 6 |
| Example 2 | Yes | 64 | 13 | 10 | 13 |
| Example 3 | No | 51 | 11 | 5 | 33 |
| Example 4 | Yes | 73 | 12 | 8 | 7 |
| Example 5 | No | 60 | 10 | 5 | 25 |
| Example 6 | Yes | 79 | 12 | 6 | 3 |
| Example 7 | Yes | 88 | 9 | 2 | 1 |
| Example 8 | Yes | 94 | 4 | 1 | 1 |
| Comparative example 1 | No | 2 | 0 | 3 | 95 |

It can be seen from Tables 5 to 8 that the bonded bodies according to the examples satisfied favorable conditions. The Cu—Sn alloy was the major part of the bonding layer. Also, it was observed that the first Cu—Sn alloy and the second Cu—Sn alloy each were intermetallic compounds.

EDX point analysis of ten arbitrary locations in the region of the Cu—Sn alloy was performed. Also, EDX point analysis of ten arbitrary locations in the region of the Ti—Sn alloy was performed. As shown in the ternary phase diagram of FIG. 3, all of the results were within the range of the first composition region. Also, in the EDX point analysis result of the Cu—Sn alloy, the composition of not less than 80% and not more than 100% of the Cu—Sn alloy was within the range of the second composition region. In the EDX point analysis result of not less than 80% and not more than 100% of the Ti—Sn alloy, the composition of not less than 80% and not more than 100% of the Ti—Sn alloy was within the range of the third composition region.

"Other" in the area ratio of Table 8 is a region in which the Ti reaction layer, a carbide, or a metal component melted apart and existed alone.

The thickness of the Ti reaction layer was not more than 1 μm for the bonded bodies according to the examples. Also, both TiN and $Ti_2N$ were observed in the Ti reaction layer.

In contrast, in the comparative example 1, Cu—Sn alloys that had different composition ratios were not confirmed. In the comparative example 1, a trace of a Cu—Sn alloy was observed, but Cu—Sn alloys having different compositions were not observed. It is considered that a AgCu eutectic solid or AgSn was the major part of the bonding layer in the comparative example 1.

Then, one hundred each of the bonded bodies according to the examples and the comparative examples were manufactured. The bonding strengths and the warp amounts were measured.

The bonding strength was measured using a peel test. Specifically, a peel test sample was prepared for the examples and the comparative example. In the sample, a rectangular copper plate was bonded to the ceramic substrate. At this time, the bonding was performed so that one end of the copper plate jutted from the ceramic substrate. The peel strength was measured by perpendicularly pulling the jutting copper plate.

Also, for the warp amount, the warp amount at the long side of the bonded body was measured. Examples in which the warp amount was not more than 0.3 mm for not less than ninety of the bonded bodies was called "best". Examples in which the warp amount was not more than 0.3 mm for seventy to eighty-nine of the bonded bodies was called "good". Examples in which the warp amount was greater than 0.3 mm for not less than thirty-one of the bonded bodies was called "no-good". The results are shown in Table 9.

TABLE 9

| | Bonding strength (kN /mm) | Warp amount |
|---|---|---|
| Example 1 | 18 | Best |
| Example 2 | 17 | Best |
| Example 3 | 15 | Best |
| Example 4 | 16 | Best |
| Example 5 | 15 | Good |
| Example 6 | 25 | Best |
| Example 7 | 30 | Best |
| Example 8 | 33 | Best |
| Comparative example 1 | 17 | No-good |

It can be seen from Table 9 that the bonding strengths of the bonded bodies according to the examples were equal to that of the bonded body according to the comparative example 1 that used a Ag-including brazing material. The warp amount could be suppressed even when the size of the bonded body was large, i.e., not less than 200 mm. The warp amount is suppressed even when the heating rate and the cooling rate are increased. Therefore, it can be seen that the bonded body has good suitability for mass production. Conversely, many of the bonded bodies of the comparative example 1 had warp amounts greater than 0.3 mm. This is because Cu—Sn alloys that had different composition ratios were not formed.

The Sn amount of the copper plate was examined for the bonded bodies according to the examples and the comparative examples. The Sn amount was measured by analyzing the cross section of the bonded body with EDX. The boundary between the bonding layer and the copper plate was defined using the method described above. The Sn amount at the boundary between the bonding layer and the copper plate was taken as Sn-1; the Sn amount at a location separated 10 μm from the boundary was taken as Sn-2; and the Sn amount at a location separated 20 μm from the boundary was taken as Sn-3. Sn-2/Sn-1 and Sn-3/Sn-1 were calculated.

It was also confirmed whether or not the point most distant to the boundary in the regions in which Sn was detected was within 50 μm. Examples that were within 50 μm were labeled "○", and examples that were greater than 50 μm were labeled "x" (cross).

The existence or absence of voids in the bonding layer also was examined. The existence or absence of voids was examined by ultrasonic inspection (SAT). The void volume ratio was labeled "◎" (double circle) when not less than 0% and not more than 0.3%, "○" (single circle) when not less than 0.4% and not more than 1%, "Δ" (triangle) when not less than 2% and not more than 3%, and "x" (cross) when not less than 4%. The results are shown in Table 10.

TABLE 10

| | Sn amount of copper plate | | | | |
|---|---|---|---|---|---|
| | Sn amount of Sn-1 (at %) | Sn-2/ Sn-1 | Sn-3/ Sn-1 | Diffusion distance within 50 μm | Void volume ratio |
| Example 1 | 5.9 | 0.4 | 0.2 | ○ | ○ |
| Example 2 | 4.5 | 0.5 | 0.3 | ○ | ○ |
| Example 3 | 7.2 | 0.4 | 0.2 | ○ | ○ |
| Example 4 | 6.2 | 0.5 | 0.3 | ○ | ○ |
| Example 5 | 7.4 | 0.6 | 0.5 | ○ | Δ |
| Example 6 | 3.8 | 0.6 | 0.4 | ○ | ◎ |
| Example 7 | 5.1 | 0.5 | 0.2 | ○ | ◎ |
| Example 8 | 5.2 | 0.4 | 0.2 | ○ | ◎ |
| Comparative example 1 | 12 | 0.8 | 0.6 | X | X |

It can be seen from Tables 9 and Table 10 that for the bonded bodies according to the examples, it was found that the diffusion of Sn into the copper plate was suppressed. Also, it was found that the void area was small. In particular, the bonding strength was high, i.e., not less than 25 kN/mm, in the examples 6 to 8 in which the void area was reduced.

In contrast, in the comparative example, the diffusion amount of Sn into the copper plate was large, and the void area ratio also was large.

While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions, and are within the scope of the inventions described in the claims and their equivalents. Also, the embodiments described above can be implemented in combination with each other.

What is claimed is:

1. A bonded body, comprising:

a ceramic substrate;

a copper plate; and a bonding layer located on at least one surface of the ceramic substrate, the bonding layer bonding the ceramic substrate and the copper plate, the bonding layer including a Ti reaction layer including titanium nitride or titanium oxide as a major component, and a plurality of first alloys positioned between the Ti reaction layer and the copper plate, each of the plurality of first alloys including at least one selected from a Cu—Sn alloy and a Cu—In alloy, the plurality of first alloys having mutually-different Sn concentrations or In concentrations, and the bonding layer including a titanium silicide grain having a major diameter of not less than 0.5 μm and not more than 6 μm.

2. The bonded body according to claim 1, wherein
the bonding layer further includes a second alloy positioned between the Ti reaction layer and the copper plate,
the second alloy includes at least one selected from a Ti—Sn alloy and a Ti—In alloy, and
a total surface area of the plurality of first alloys is greater than a total surface area of the second alloy based respectively on average values analyzed in three regions, each of the three regions being a thickness of the bonding layer×40 μm in a width direction.

3. The bonded body according to claim 2, wherein
at least a portion of the plurality of first alloys is a Cu—Sn alloy,
the second alloy is a Ti—Sn alloy, and
the at least a portion of the plurality of first alloys and the second alloy detected by EDX point analysis of the bonding layer are within a region of a ternary phase diagram of Cu, Sn, and Ti surrounded with (97, 3, 0), (60, 40, 0), (2, 40, 58), and (39, 3, 58).

4. The bonded body according to claim 1, wherein
at least a portion of the plurality of first alloys is a Cu—Sn alloy, and
the at least a portion of the plurality of first alloys detected by EDX point analysis of the bonding layer is within a region of a ternary phase diagram of Cu, Sn, and Ti surrounded with (97, 3, 0), (77, 23, 0), (52, 23, 25), and (72, 3, 25).

5. The bonded body according to claim 2, wherein
the second alloy is a Ti—Sn alloy, and
the second alloy detected by EDX point analysis of the bonding layer is within a region of a ternary phase diagram of Cu, Sn, and Ti surrounded with (41, 23, 36), (24, 40, 36), (2, 40, 58), and (19, 23, 58).

6. The bonded body according to claim 1, wherein
a Ti content in at least one of the plurality of first alloys is not more than 1 atomic %.

7. The bonded body according to claim 1, wherein
a Sn content in a portion of the plurality of first alloys is not less than 3 atomic % and not more than 9 atomic %, and
a Sn content in another portion of the plurality of first alloys is not less than 10 atomic % and not more than 30 atomic %.

8. The bonded body according to claim 1, wherein
a solidification point or a phase change point of at least one of the plurality of first alloys is not less than 400° C. and not more than 600° C.

9. The bonded body according to claim 1, wherein
the Ti reaction layer includes titanium nitride grains having an average grain size of not more than 50 nm,
a first element exists at a grain boundary of the titanium nitride grains, and
the first element includes one or two selected from Cu, Sn, and In.

10. The bonded body according to claim 1, wherein
an average value of a total surface area of the plurality of first alloys analyzed in three regions is not less than 50% and not more than 95% of a surface area of each of the three regions, and
each of the three regions is a thickness of the bonding layer×40 μm in a width direction.

11. The bonded body according to claim 1, wherein
the bonding layer includes a plurality of the titanium silicide grains, and an area ratio of the plurality of titanium silicide grains in a region of a thickness of the bonding layer×200 μm in a width direction is not less than 1% and not more than 15%.

12. The bonded body according to claim 1, wherein
the bonding layer further includes carbon.

13. The bonded body according to claim 1, wherein
a thickness of the Ti reaction layer is not more than 1 μm.

14. The bonded body according to claim 1, wherein
a thickness of the copper plate is not less than 0.5 mm,
a first element exists at a boundary between the bonding layer and the copper plate,
the first element includes one or two selected from Sn and In,
a ratio C2/C1 of a second concentration C2 to a first concentration C1 is not more than 0.60,
the first concentration C1 is of the first element at the boundary, and
the second concentration C2 is of the first element in a region in the copper plate separated 10 μm from the boundary.

15. The bonded body according to claim 3, wherein
at least a portion of the plurality of first alloys is a Cu—Sn alloy, and
the at least a portion of the plurality of first alloys detected by EDX point analysis of the bonding layer is within a region of a ternary phase diagram of Cu, Sn, and Ti surrounded with (97, 3, 0), (77, 23, 0), (52, 23, 25), and (72, 3, 25).

16. The bonded body according to claim 15, wherein
the second alloy is a Ti—Sn alloy, and
the second alloy detected by EDX point analysis of the bonding layer is within a region of a ternary phase diagram of Cu, Sn, and Ti surrounded with (41, 23, 36), (24, 40, 36), (2, 40, 58), and (19, 23, 58).

17. The bonded body according to claim 16, wherein
a Sn content in a portion of the plurality of first alloys is not less than 3 atomic % and not more than 9 atomic %, and
a Sn content in another portion of the plurality of first alloys is not less than 10 atomic % and not more than 30 atomic %.

18. A ceramic circuit substrate, comprising:
the bonded body according to claim 1.

19. A semiconductor device, comprising:
the ceramic circuit substrate according to claim 18; and
a semiconductor element mounted to the ceramic circuit substrate.

20. A bonded body, comprising:
a ceramic substrate;
a copper plate; and
a bonding layer located on at least one surface of the ceramic substrate,
the bonding layer bonding the ceramic substrate and the copper plate,
the bonding layer including
a Ti reaction layer including titanium nitride or titanium oxide as a major component, and
a plurality of first alloys positioned between the Ti reaction layer and the copper plate,
each of the plurality of first alloys including at least one selected from a Cu—Sn alloy and a Cu—In alloy,
the plurality of first alloys having mutually-different Sn concentrations or In concentrations,
the Ti reaction layer including titanium nitride grains having an average grain size of not more than 50 nm, a first element existing at a grain boundary of the titanium
  nitride grains, and
the first element including one or two selected from Cu,
  Sn, and In.

* * * * *